(12) United States Patent
Jang et al.

(10) Patent No.: US 10,869,397 B2
(45) Date of Patent: Dec. 15, 2020

(54) HOUSING INCLUDING CERAMIC COMPOSITION AND ELECTRONIC DEVICE INCLUDING THE HOUSING

(71) Applicant: Samsung Electronics Co., Ltd., Gyeonggi-do (KR)

(72) Inventors: Jigu Jang, Gyeonggi-do (KR); Hoyoung Lee, Gyeonggi-do (KR); Duyeong Choi, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/431,353

(22) Filed: Jun. 4, 2019

(65) Prior Publication Data

US 2019/0373744 A1 Dec. 5, 2019

(30) Foreign Application Priority Data

Jun. 4, 2018 (KR) .................. 10-2018-0064214

(51) Int. Cl.
*H05K 5/00* (2006.01)
*H05K 5/02* (2006.01)

(52) U.S. Cl.
CPC ......... *H05K 5/0017* (2013.01); *H05K 5/0086* (2013.01); *H05K 5/0247* (2013.01)

(58) Field of Classification Search
CPC ... H05K 5/0017; H05K 5/0086; H05K 5/0247
See application file for complete search history.

(56) References Cited

U.S. PATENT DOCUMENTS

| 5,583,742 A * | 12/1996 | Noda | G06F 1/1626 248/632 |
| 7,106,580 B2 * | 9/2006 | Kugimiya | G06F 1/1616 248/176.1 |
| 7,697,281 B2 * | 4/2010 | Dabov | G06F 1/1626 361/679.55 |
| 8,421,763 B2 * | 4/2013 | Liao | G06F 1/1616 345/173 |

(Continued)

FOREIGN PATENT DOCUMENTS

| EP | 1 555 594 | 1/2013 |
| EP | 2 521 948 | 3/2017 |

(Continued)

OTHER PUBLICATIONS

International Search Report dated Oct. 2, 2019 issued in counterpart application No. PCT/KR2019/006663, 15 pages.

*Primary Examiner* — Hoa C Nguyen
*Assistant Examiner* — Keith DePew
(74) *Attorney, Agent, or Firm* — The Farrell Law Firm, P.C.

(57) ABSTRACT

A housing of an electronic device includes a first surface facing a first direction, a second surface facing a second direction opposite to a first direction, and a third surface surrounding a space between the first surface and the second surface. The third surface includes a plurality of corner areas, and a plurality of plane areas to connect the corner areas to each other. A plane area of the plurality of plane areas includes a recess area on the housing recessed inward along a peripheral portion of the recess area, and an opening is formed in the recess area passing through an inner part and an outer part of the third surface.

18 Claims, 10 Drawing Sheets

(56) References Cited

U.S. PATENT DOCUMENTS

| | | | |
|---|---|---|---|
| 8,923,937 B2* | 12/2014 | Tages | H05K 5/03 |
| | | | 455/575.8 |
| 9,363,343 B2* | 6/2016 | Rao | H04M 1/0274 |
| D786,226 S * | 5/2017 | Kim | D14/248 |
| 9,699,279 B2* | 7/2017 | Lee | H04M 1/0202 |
| 9,793,646 B2* | 10/2017 | Iwamoto | G06F 1/1656 |
| 9,917,934 B2 | 3/2018 | Mittleman et al. | |
| 10,003,679 B2 | 6/2018 | Lee et al. | |
| 2005/0130470 A1 | 6/2005 | Kugimiya et al. | |
| 2009/0219684 A1* | 9/2009 | Mori | G06F 1/1626 |
| | | | 361/679.56 |
| 2009/0245564 A1 | 10/2009 | Mittleman et al. | |
| 2009/0257189 A1* | 10/2009 | Wang | H04M 1/0249 |
| | | | 361/679.56 |
| 2012/0118773 A1* | 5/2012 | Rayner | G06F 1/1626 |
| | | | 206/320 |
| 2012/0182678 A1* | 7/2012 | Wu | H04M 1/04 |
| | | | 361/679.01 |
| 2012/0294469 A1* | 11/2012 | Weaver, III | H04R 1/2857 |
| | | | 381/334 |
| 2012/0325720 A1* | 12/2012 | Tages | H04B 1/3888 |
| | | | 206/522 |
| 2013/0296004 A1* | 11/2013 | Tages | H05K 5/03 |
| | | | 455/575.8 |
| 2014/0265762 A1* | 9/2014 | Murphy | B23P 19/00 |
| | | | 312/223.1 |
| 2015/0103018 A1* | 4/2015 | Kamin-Lyndgaard | |
| | | | G09G 5/006 |
| | | | 345/173 |
| 2016/0050302 A1* | 2/2016 | Lee | H04M 1/185 |
| | | | 455/575.1 |
| 2016/0051021 A1* | 2/2016 | Onda | A45C 11/00 |
| | | | 224/191 |
| 2016/0089811 A1* | 3/2016 | Matsuyuki | B28D 1/14 |
| | | | 428/131 |
| 2016/0233573 A1* | 8/2016 | Son | H04M 1/0202 |
| 2016/0234949 A1* | 8/2016 | Seo | H04M 1/0202 |
| 2016/0306389 A1* | 10/2016 | Urimoto | G06F 1/1656 |
| 2017/0212558 A1* | 7/2017 | Ely | G06F 1/183 |
| 2017/0302766 A1 | 10/2017 | Lee et al. | |
| 2017/0347476 A1* | 11/2017 | Hwang | C23C 16/44 |
| 2018/0110143 A1* | 4/2018 | Zhao | H04B 1/3816 |
| 2018/0249586 A1* | 8/2018 | Kim | B32B 27/36 |
| 2018/0320859 A1* | 11/2018 | Philip | F21V 13/08 |

FOREIGN PATENT DOCUMENTS

| | | |
|---|---|---|
| JP | 2013-175974 | 9/2013 |
| KR | 1020170092794 | 8/2017 |

* cited by examiner

HOUSING INCLUDING CERAMIC COMPOSITION AND ELECTRONIC DEVICE INCLUDING THE HOUSING

CROSS-REFERENCE TO RELATED APPLICATION(S)

This application is based on and claims priority under 35 U.S.C. § 119 to Korean Patent Application No. 10-2018-0064214, filed on Jun. 4, 2018, in the Korean Intellectual Property Office, the disclosure of which is incorporated by reference herein its entirety.

BACKGROUND

1. Field

The present disclosure relates generally to a housing including a ceramic composition and an electronic device including the same.

2. Description of Related Art

An outer portion of a mobile electronic device includes various types of materials to provide pleasing aesthetics and excellent grip. The electronic device may include a metal material to provide a metallic texture, or may include a tempered glass material to provide a shiny feel. The tempered glass material may be easily scratched depending on how the electronic device is used.

Recently, studies have been performed to substitute ceramic for another material on the outer portion or housing of the electronic device. However, a ceramic material may be weak and brittle, and the electronic device may be easily damaged if an external impact is encountered.

Thus, it may be advantageous to provide a housing of an electronic device at least partially including a ceramic material, which is strong against an external impact, and an electronic device including the housing.

SUMMARY

The present disclosure has been made to address the above-mentioned problems and disadvantages, and to provide at least the advantages described below.

In accordance with an aspect of the present disclosure, a housing of an electronic device includes a first surface facing a first direction, a second surface facing a second direction opposite to a first direction, and a third surface surrounding a space between the first surface and the second surface. The third surface includes a plurality of corner areas, and a plurality of plane areas to connect the corner areas to each other. A plane area of the plurality of plane areas includes a recess area on the housing recessed inward along a peripheral portion of the recess area, and an opening is formed in the recess area passing through an inner part and an outer part of the third surface In accordance with another aspect of the present disclosure, an electronic device includes a first surface on which a display is disposed, a second surface facing the first surface, and a side surface surrounding a space between the first surface and the second surface. The side surface includes a first corner area, a second corner area facing the first corner area in a first direction, a first plane area extending in a second direction from the first corner area, and a second plane area extending in the second direction from the second corner area and facing the first plane area in the first direction. An end portion of the first corner area is connected with the first plane area and is spaced apart from an end portion of the second corner, and the first plane area is connected with the second plane area along a first width. The first plane area may is spaced apart from the second plane area by a second width, and the first width may be greater than the second width.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
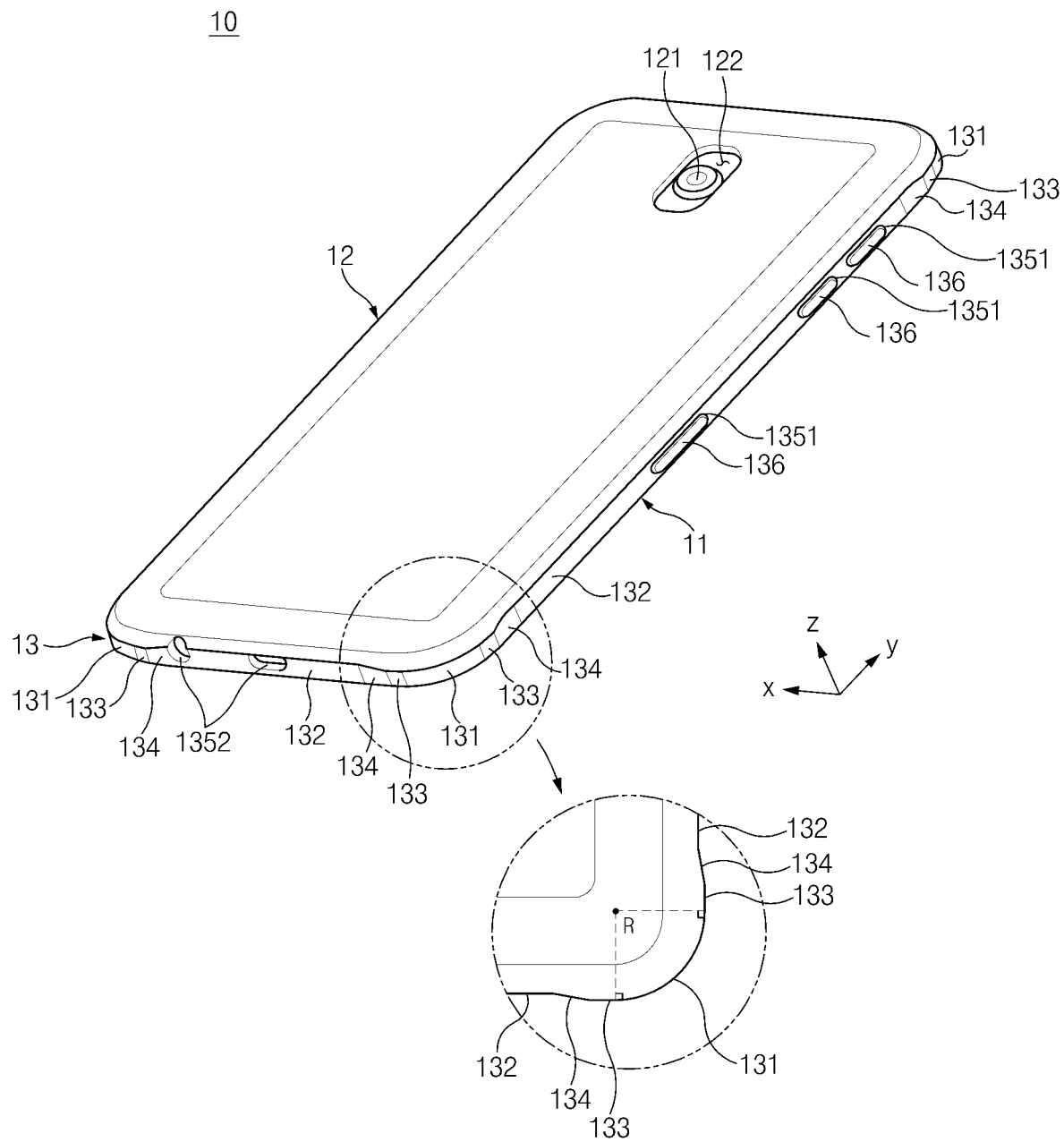
FIG. 1 is a perspective view illustrating an electronic device, according to an embodiment.

Hereinafter, various embodiments of the disclosure may be described with reference to accompanying drawings. Accordingly, those of ordinary skill in the art will recognize that modifications, equivalents, and/or alternatives on the various embodiments described herein can be variously made without departing from the scope and spirit of the disclosure.

For example, the size of each component in the drawings may be exaggerated or reduced for the convenience of explanation. The size and the thickness of each component in the drawings are provided only for the convenience of explanation, and the disclosure is not limited thereto. In addition, a Cartesian coordinate system may be used, in which an x-axis direction may refer to the widthwise direction of the electronic device, a y-axis direction may refer to the lengthwise direction of the electronic device, and a z-axis direction may refer to the thickness direction of the electronic device. However, the x-axis, the y-axis, and the z-axis are not limited to three axes on the Cartesian coordinate system, and may be interpreted in a broad sense to include the three axes. For example, the x-axis, the y-axis, and the z-axis may be orthogonal to each other, but may refer to different directions that are not orthogonal to each other. With regard to description of drawings, similar components may be marked using similar reference numerals.

As used herein, the expressions "have", "may have", "include" and "comprise", or "may include" and "may comprise" may indicate the existence of corresponding features (e.g., components such as numeric values, functions, operations, or parts) but do not exclude the presence of additional features.

As used herein, the expressions "A or B", "at least one of A and/or B", or "one or more of A and/or B" may include any and all combinations of one or more of the associated listed items. For example, the term "A or B", "at least one of A and B", or "at least one of A or B" may refer to any of a case (1) where at least one A is included, a case (2) where at least one B is included, or a case (3) where both of at least one A and at least one B are included.

Terms, such as "first", "second", may be used in various embodiments of the disclosure may refer to various components regardless of order and/or priority. The terms may be used to distinguish relevant components from other components. For example, "a first user device" and "a second user device" may indicate different user devices regardless of order or priority. Additionally, without departing from the scope of the present disclosure, a first component may be referred to as a second component, and similarly, a second component may be referred to as a first component.

It is to be understood that when an element (e.g., a first element) is referred to as being "operatively" or "communicatively" "coupled with", "coupled to", "connected with" or "connected to" another element (e.g., a second element), the element can be directly coupled with/to another element or coupled with/to another element via an intervening element (e.g., a third element). In contrast, when an element (e.g., a first element) is referred to as being "directly coupled with", "directly coupled to", "directly connected with" or "directly connected to" another element (e.g., a second element), it should be understood that there is no intervening element (e.g., a third element).

According to the situation, the expression "configured to" may be used interchangeably with, for example, the expression "suitable for", "having the capacity to", "designed to", "adapted to", "made to", or "capable of". The term "configured to" may not mean only "specifically designed to" in hardware. Instead, the expression "a device configured to" may mean that the device is "capable of" operating together with another device or other parts. For example, a "central processing unit (CPU) configured to perform A, B, and C" or "a CPU set to perform A, B, and C" may mean a dedicated CPU (e.g., an embedded CPU) for performing a corresponding operation or a generic-purpose CPU (e.g., CPU or an application processor) which performs corresponding operations by executing one or more software programs which are stored in a memory device.

Terms in the disclosure are used to describe specified embodiments and are not intended to limit the scope of the disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in the disclosure. In some cases, even if terms are defined in the disclosure, they may not be interpreted to exclude embodiments of the disclosure.

An electronic device according to various embodiments of the present disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) audio layer 3 (MP3) players, mobile medical devices, cameras, wearable devices (e.g., smart glasses, head-mounted-devices (HMDs)), electronic apparel, electronic bracelets, electronic necklaces, electronic accessories, electronic tattoos, smart mirrors, or smart watches.

According to various embodiments, the electronic device may be a smart home appliance. The smart home appliances may include at least one of, for example, televisions (TVs), digital versatile disk (DVD) players, audio players, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, and electronic picture frames.

According to another embodiment, an electronic device may include at least one of various medical devices (e.g., various portable medical measurement devices (e.g., blood glucose monitoring devices, heartbeat measuring devices, blood pressure measuring devices, and body temperature measuring devices), a magnetic resonance angiography (MRA), a magnetic resonance imaging (MRI), a computed tomography (CT), scanners, and ultrasonic devices), navigation devices, a global positioning system receiver (GPS), event data recorders (EDRs), flight data recorders (FDRs), vehicle infotainment devices, electronic equipment for vessels (e.g., navigation systems and gyrocompasses), avionics, security devices, head units for vehicles, industrial or home robots, automated teller machines (ATMs), points of sales (POSs) devices for stores, or Internet of things (IoT) devices (e.g., light bulbs, various sensors, electric or gas meters, sprinkler devices, fire alarms, thermostats, street lamps, toasters, exercise equipment, hot water tanks, heaters, and boilers).

According to an embodiment, the electronic device may include at least one of parts of furniture or buildings/structures, electronic boards, electronic signature receiving devices, projectors, or various measuring instruments (e.g., water meters, electricity meters, gas meters, or wave meters). In an embodiment, the electronic device may be one of the above-described devices or a combination thereof. An electronic device may be a flexible electronic device. Furthermore, an electronic device according to an embodiment of the present disclosure may not be limited to the above-described electronic devices and may include other electronic devices and new electronic devices according to the development of technologies.

Hereinafter, an outer portion or at least a portion of a housing of an electronic device may include a composition including a ceramic material. The ceramic material may have gloss higher than a metal material or a plastic material, thereby forming an aesthetic sense.

FIG. 1 is a perspective view illustrating an electronic device, according to an embodiment.

Referring to FIG. 1, an electronic device 10 includes a first surface 11, a second surface 12, and a third surface 13. The first surface 11 may face a first direction (e.g., +z axis direction), and the second surface 12 may face a second direction (e.g., −z axis direction) opposite to the first direction. The first surface 11 and the second surface 12 may face each other. The third surface 13 may surround a space between the first surface 11 and the second surface 12. The third surface 13 may be referred to as a side surface.

Figure 3A:
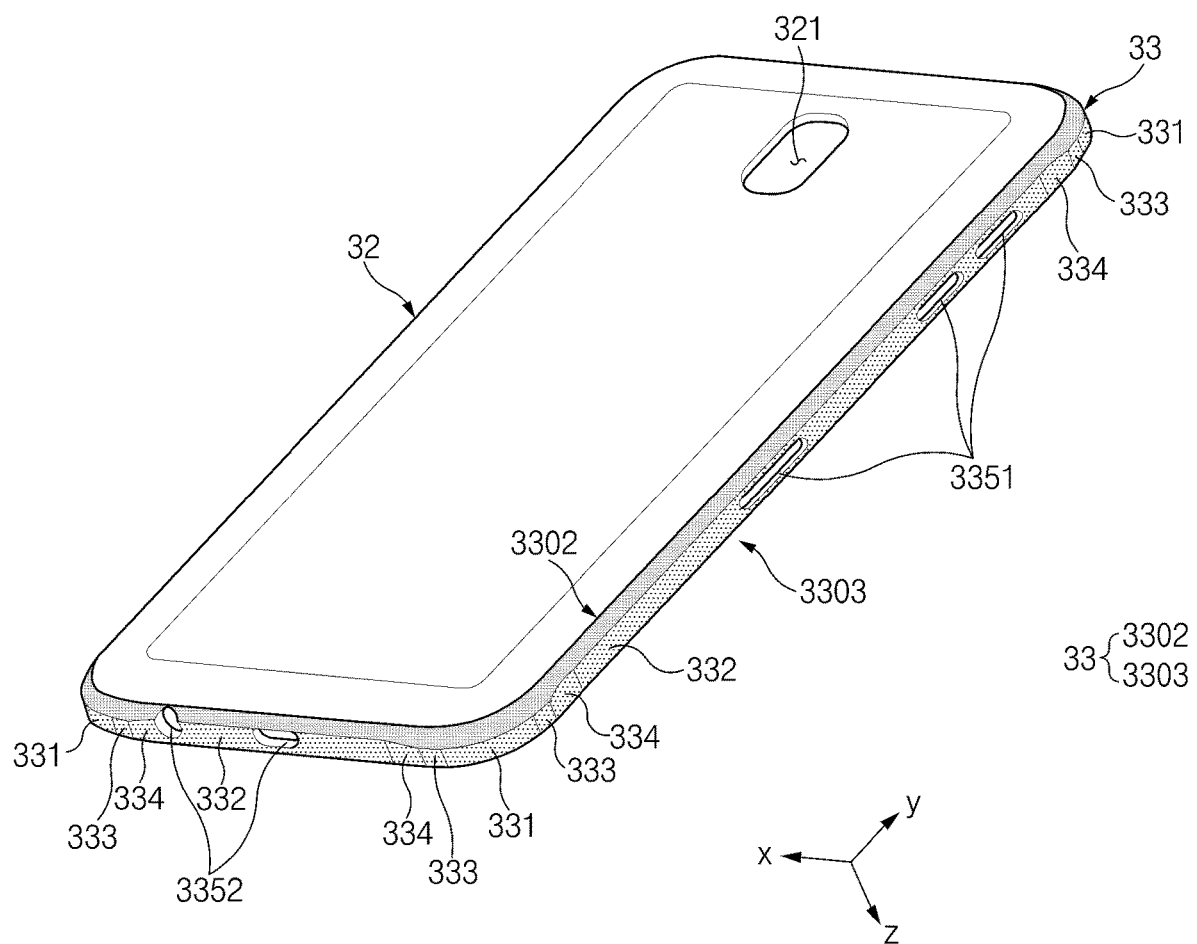
FIGS. 3A and 3B are perspective views of a housing, according to an embodiment.
Figure 3B:
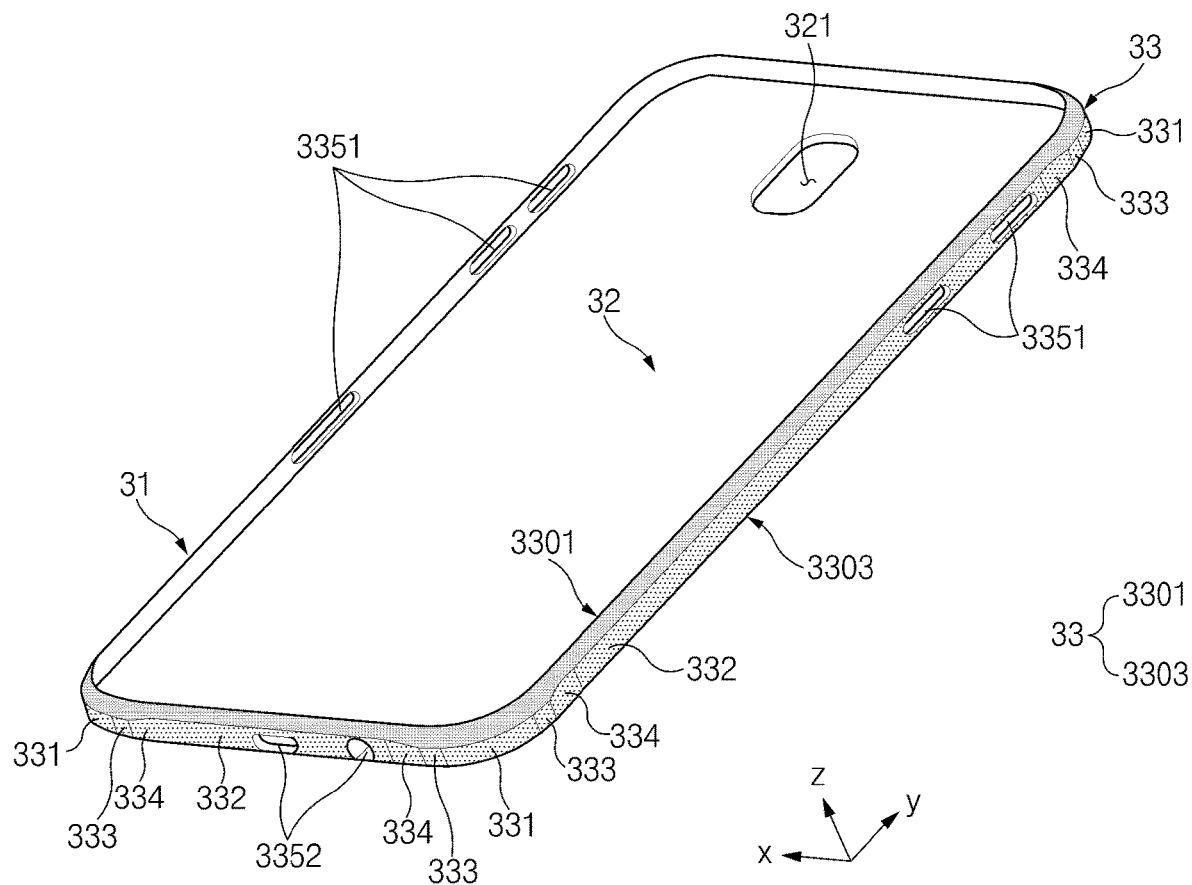

The first surface 11, the second surface 12, and the third surface 13 of the electronic device 10 may respectively be referred to as a first surface 31, a second surface 32, and a third surface 33 of a housing 30 of FIGS. 3A-3B forming an outer portion of the electronic device 10. In addition, areas included in the third surface 13 of the electronic device 10 may be referred to as areas included in the third surface 33 of the housing 30 of FIGS. 3A-3B.

A display may be disposed on the first surface 11 of the electronic device 10 while facing the first direction (e.g., +z axis direction). The second surface 12 of the electronic device 10 may be formed to face the second direction (e.g., −z axis direction) opposite to the first direction, and a camera area 122, through which a camera 121 disposed inside the electronic device 10 is exposed to the outside, may be formed in the second surface 12. The camera area 122 may include transparent glass, and the camera 121 may be disposed under the glass.

The third surface 13 may include a plurality of corner areas 131, one plane area among a plurality of plane areas 132 formed between the corner areas 131, a plurality of extension areas 133 respectively extending from the corner areas 131, and a connection area 134 connecting the extension areas 133 with the plane area among the plurality of plane areas 132.

Referring to FIG. 1, one corner area of the plurality of corner areas 131 may be extended from a first plane area among the plurality of plane areas 132 to a second plane area among the plurality of plane areas 132, and may be provided in the form of a curved surface having a specific curvature. The corner areas 131 may be provided in the form of curved surfaces having a specific curvature in a circumferential direction (e.g., a direction rotating about the z axis) of the electronic device 10. The extension areas 133 may be connected to one end portion (e.g., one end portion in the circumferential direction) of the corner areas 131. Extension areas 133 may be connected to opposite end portions of some of the corner areas 131.

Referring to FIG. 1, a plurality of plane areas 132 may constitute a large portion of the third surface 13 of the electronic device 10. Each of the plane areas 132 may be interposed between two of the corner areas 131. The opposite end portions of the plane areas 132 in the circumferential direction may be respectively connected to the corner areas 131.

Portions of the plane areas 132 may be recessed inward (e.g., a direction perpendicular to the first direction, the second direction, an x axis direction or a y axis direction) from a peripheral portion of the electronic device 10. The plane areas 132 may be recessed inward from an end portion of the corner areas 131, which is adjacent to the plane areas 132, or the extension areas 133 extending from the corner areas 131.

The plane areas 132 may have one or more openings 1351 and 1352 formed therein. The opening may include a first opening 1351, in which a button member 136 is inserted and at least a portion of the button member 136 is exposed to the plane area 132, and a second opening 1352, in which an external interface member is inserted to be electrically connected to the electronic device 10. The button member 136 may be pressed into or out of the housing to execute or stop various functions of the electronic device 10. The button member 136 may include buttons, such as a power key to turn on the power of the electronic device 10 or a volume key to adjust the volume of the electronic device 10, associated with various functions of the electronic device 10. The second opening 1352 may include a universal serial bus (USB) connector port or an earphone connector port, and the external interface member inserted into the second opening 1352 may be a USB connector or an earphone.

The openings 1351 and 1352 may be formed in the plane areas 132 recessed inward of the electronic device 10. This is necessary to prevent an external impact from being directly applied to the electronic device 10, and easily braking, peripheral portions of the openings. For example, when the electronic device 10 is dropped to a ground surface, the impact may be directly applied to the corner area 131, and not directly applied to the plane areas 132 having the openings 1351 and 1352. Meanwhile, the corner area 131, which directly receives an impact, may be formed to be thicker than that of the plane area 132.

The third surface 13 of the electronic device 10 may further include the extension areas 133 interposed between the plane areas 132 and the corner areas 131. Referring to FIG. 1, the extension areas 133 may be formed at one end portion or opposite end portions of the corner areas 131. One end portion of the extension areas 133 may be connected with the corner areas 131 and an opposite end portion of the extension areas 133 may be connected with the plane areas 132 in the circumferential direction of the electronic device 10. The extension areas 133 may be provided in the form of a plane, when viewed from the circumferential direction of the electronic device 10, which is different from the corner areas 131. The extension areas 133 may further extend in a tangential direction to the curved surface of the corner areas 131 from one end portion of the corner areas 131 and may form a 90 degrees angle with the extension areas 133 extending in the tangential direction from an opposite end portion of the corner areas 131.

For example, referring to the enlarged view of FIG. 1, the corner areas 131 may include a curved surface having at least one radius R of a particular curvature, and the extension areas 133 may be an area extending in the tangential direction from one end portion of the corner areas 131 and provided in the form of a plane.

The plane areas 132 and the extension areas 133 connected to each other in the circumferential direction of the electronic device 10 may be arranged to have a specific step difference therebetween. For example, the plane areas 132 may be provided inward from the extension areas 133 of the electronic device 10. Additionally, the plane areas 132 may be recessed inward. Further, the extension areas 133 may protrude outward from the plane areas 132 of the electronic device 10.

The third surface 13 of the electronic device 10 may further include connection areas 134 interposed between the extension areas 133 and the plane areas 132. The connection areas 134 may be provided in the form of an inclined surface that is inclined inward or a curved surface that is convexly curved inward with a specific curvature, so as to connect the extension areas 133 extending in the tangential direction from the end portion of the corner areas 131 with the plane areas 132 recessed inward.

The third surface 13 may include a plurality of corner areas 131 and a plurality of areas (e.g., all areas 132, 133, and 134 between the plurality of corner areas 131). At least one of the plurality of areas may have a recess area (e.g., the plane areas 132) and the recess area may have an opening (e.g., the first opening 1351 or the second opening 1352). In this case, the recess area may be referred to as an area recessed inward from the peripheral portion of the housing. In addition, the third surface 13 may further include a connection area (e.g., the connection areas 134) to connect the recess area with a peripheral portion of the recess area.

A corner area may be interpreted as being an area including the corner areas 131 and the extension areas 133. In this case, the corner area may include a curved portion (e.g., the corner areas 131) and a plane portion (e.g., the extension areas 133).

Figure 2:
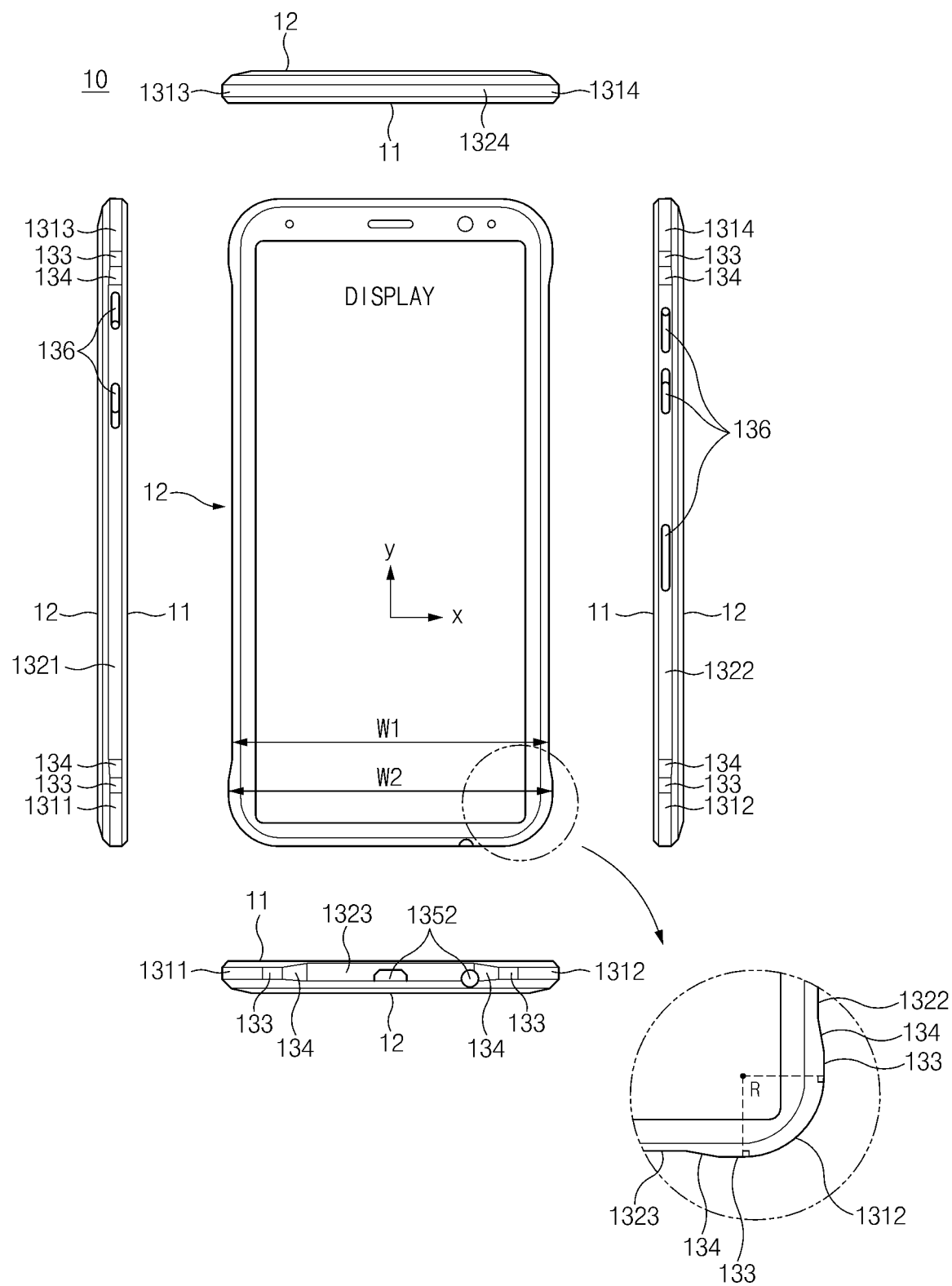
FIG. 2 is a development view illustrating an electronic device, according to an embodiment.

FIG. 2 is a development view illustrating an electronic device, according to an embodiment.

Referring to FIG. 2, a plurality of corner areas 131 may include, when viewed from the front view of the electronic device 10 illustrated in FIG. 2, a first corner area 1311 formed at a left lower end portion, a second corner area 1312 formed at a right lower end portion, a third corner area 1313 formed at a left upper end portion, and a fourth corner area 1314 formed at a right upper end portion.

Referring to the left side view of the electronic device 10, a first plane area 1321 may extend in the y axis direction from the first corner area 1311 and may be interposed between the first corner area 1311 and the third corner area 1313. The extension area 133 extending in the tangential direction from a y-axis directional end portion of the first corner area 1311 and the connection area 134 to connect the extension area 133 with the first plane area 1321 may be interposed between the first plane area 1321 and the first corner area 1311. Similarly, the extension area 133 extending in the tangential direction from a y-axis directional end portion of the third corner area 1313 and the connection area 134 to connect the extension area 133 with the first plane area 1321 may be interposed between the first plane area 1321 and the third corner area 1313.

Referring to the right side view of the electronic device 10, a second plane area 1322 may extend in the y axis direction from the second corner area 1312 and may be interposed between the second corner area 1312 and the fourth corner area 1314. The extension area 133 extending in the tangential direction from a y-axis directional end portion of the second corner area 1312 and the connection area 134 to connect the extension area 133 with the second plane area 1322 may be interposed between the second plane area 1322 and the second corner area 1312. The extension area 133 extending in the tangential direction from a y-axis directional end portion of the fourth corner area 1314 and the connection area 134 to connect the extension area 133 with the second plane area 1322 may be interposed between the second plane area 1322 and the fourth corner area 1314.

Referring to the bottom view of the electronic device 10, a third plane area 1323 may extend in the x axis direction from the first corner area 1311 and may be interposed between the first corner area 1311 and the second corner area 1312. The extension area 133 extending in the tangential direction from an x-axis directional end portion of the first corner area 1311 and the connection area 134 to connect the extension area 133 with the third plane area 1323 may be interposed between the third plane area 1323 and the first corner area 1311. Similarly, the extension area 133 extending in the tangential direction from an x-axis directional end portion of the second corner area 1312 and the connection area 134 to connect the extension area 133 with the third plane area 1323 may be interposed between the third plane area 1323 and the second corner area 1312.

Referring to the top view of the electronic device 10, a fourth plane area 1324 may extend in the x axis direction from the third corner area 1313 and may be interposed between the third corner area 1313 and the fourth corner area 1314. Meanwhile, the fourth plane area 1324 may not be recessed inward and may extend in the tangential direction from the corner area 131. When the fourth plane area 1324, in which the openings 1351 and 1352 are not formed, is recessed inward, an impact may be concentratedly applied to the corner area 131.

The electronic device 10 may have a first width w1 and a second width w2. The first width w1 may be the distance between the plane areas 132 facing each other and the second width w2 may be the distance between the extension areas 133 facing each other. For example, the second width w2 may be formed between the extension area of the extension areas 133 connected to the y-axis directional end portion of the first corner area 1311 and the extension area of the extension areas 133 connected to the y-axis directional end portion of the second corner area 1312. Meanwhile, the first width w1 may be formed between the first plane area 1321 connected to the first corner area 1311 in the y-axis direction and the second plane area 1322 connected to the second corner area 1312 in the y-axis direction. The first width w1 may be less than the second width w2. In this case, the openings 1351 and 1352 may be formed in an area forming the first width w1.

The areas between the corner areas which face each other form the second width w2, and a recess area (e.g., the plane areas 132 and the connection areas 133) formed in portions of the areas between the corner areas which face each other may form the first width w1 together with the recess area.

FIGS. 3A and 3B are perspective views of a housing, according to an embodiment.

Hereinafter, a housing 30 will be described with reference to FIGS. 3A to 6. The housing 30 may be referred to as one component (e.g., the housing forming the outer portion of the electronic device 10) of the electronic device 10. Hereinafter, redundant descriptions with respect to components of the electronic device 10 of FIGS. 1 and 2 will be omitted.

FIGS. 3A and 3B are perspective views illustrating a rear surface and a front surface of the housing, respectively. Referring to FIG. 3A, the housing 30 includes the second surface 32 facing the −z axis direction and the third surface 33 extending from the second surface 32. Referring to FIG. 3B, the housing 30 includes the first surface 31 facing the +z axis direction and the third surface 33 extending from the first surface 31. Referring to FIGS. 3A and 3B, the first surface 31 and the second surface 32 face each other, and the third surface 33 may be formed to surround a space between the first surface 31 and the second surface 32.

Referring to FIG. 3A, the second surface 32 of the housing 30 includes a camera area 321 to expose a camera (e.g., the camera 121) of the electronic device to the outside.

Referring to FIG. 3B, the first surface 31 of the housing 30 includes a display area in which a display is disposed.

Referring to FIG. 3A, the third surface 33 of the housing 30 includes a second frame part 3302 to surround the edge of the second surface 32 of the housing 30 and a central part 3303 connected to one side of the second frame part 3302. Referring to FIG. 3B, the third surface 33 of the housing 30 includes a first frame part 3301 to surround the edge of the first surface 31 of the housing 30 and the central part 3303 connected at one side of the first frame part 3301. The central part 3303 may be interposed between the first frame part 3301 and the second frame part 3302.

Referring to FIG. 3A, the second frame part 3302 is inclined while extending from the second surface 32 to one side of the central part 3303. The second frame part 3302 may include an inclined surface provided in the form of a plane. Alternatively, the second frame part 3302 may include a curved surface having a specific curvature. For example, a portion (e.g., a portion parallel to the y axis) of the second frame part 3302 may include a surface curved in a direction rotating about the y axis and another portion (e.g., a portion parallel to the x axis) of the second frame part 3302 may include a surface curved in a direction rotating about the x axis. Another portion (e.g., a peripheral portion of the corner area 131) of the second frame part 3302 may include a surface curved in a direction rotating about an arbitrary axis (e.g., a vector having an arbitrary angle on an x-y plane) between the x axis and the y axis.

Referring to FIG. 3B, similarly, the first frame part 3301 is inclined while extending from the first surface 31 to one side of the central part 3303. The first frame part 3301 may include an inclined surface provided in the form of a plane. Alternatively, the first frame part 3301 may include a curved surface having a specific curvature. For example, a portion (e.g., a portion parallel to the y axis) of the first frame part 3301 may include a surface curved in a direction rotating about the y axis and another portion (e.g., a portion parallel to the x axis) of the first frame part 3301 may include a surface curved in a direction rotating about the x axis. Another portion (e.g., a peripheral portion of the corner area 131) of the first frame part 3301 may include a surface curved in a direction rotating about an arbitrary axis (e.g., a vector having an arbitrary angle on an x-y plane) between the x axis and the y axis.

Referring to FIGS. 3A and 3B, when the first frame part 3301 and the second frame part 3302 are provided in the form of a curved surface, the directions in which the first frame part 3301 and the second frame part 3302 are curved may be different from the direction (e.g., a direction rotating about the z axis or the circumferential direction of the housing 30) in which a corner area 331 is curved.

The central part 3303 of the housing 30 may include a plurality of corner areas 331, a plane area 332 formed between the plurality of corner areas 331, an extension area 333 extending from the corner area 331, and a connection area 334 interposed between the extension area 333 and the corner area 331. In this case, the plane area 332 may be recessed inward from a peripheral portion (e.g., the extension area 333 or the corner area 331) of the plane area 332 of the housing 30. Openings 3351 and 3352 may be formed in plane areas 332.

The central part 3303 of the housing 30 may include all areas 332, 333, and 334 between the corner areas 331. Some of the areas may include one or more recess areas (e.g., the plane areas 332) having one or more openings and recessed inward.

The areas of the housing 30 correspond to the areas in the third surface 13 of the electronic device 10. Therefore, similar details corresponding to similar components will be omitted.

Figure 4:
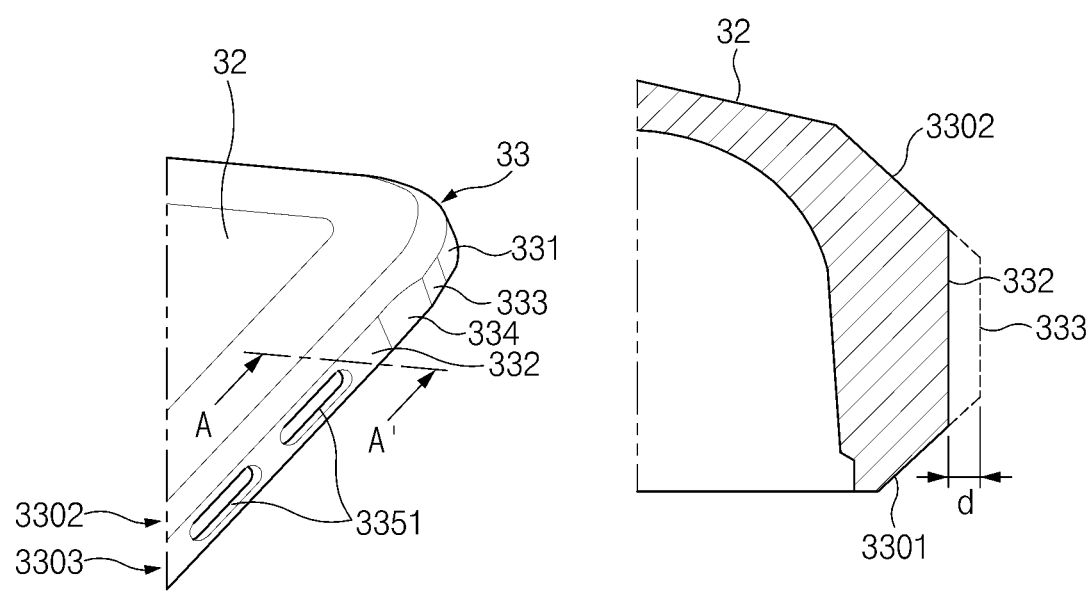
FIG. 4 is a view illustrating the recess area of a housing, according to an embodiment.
Figure 5:
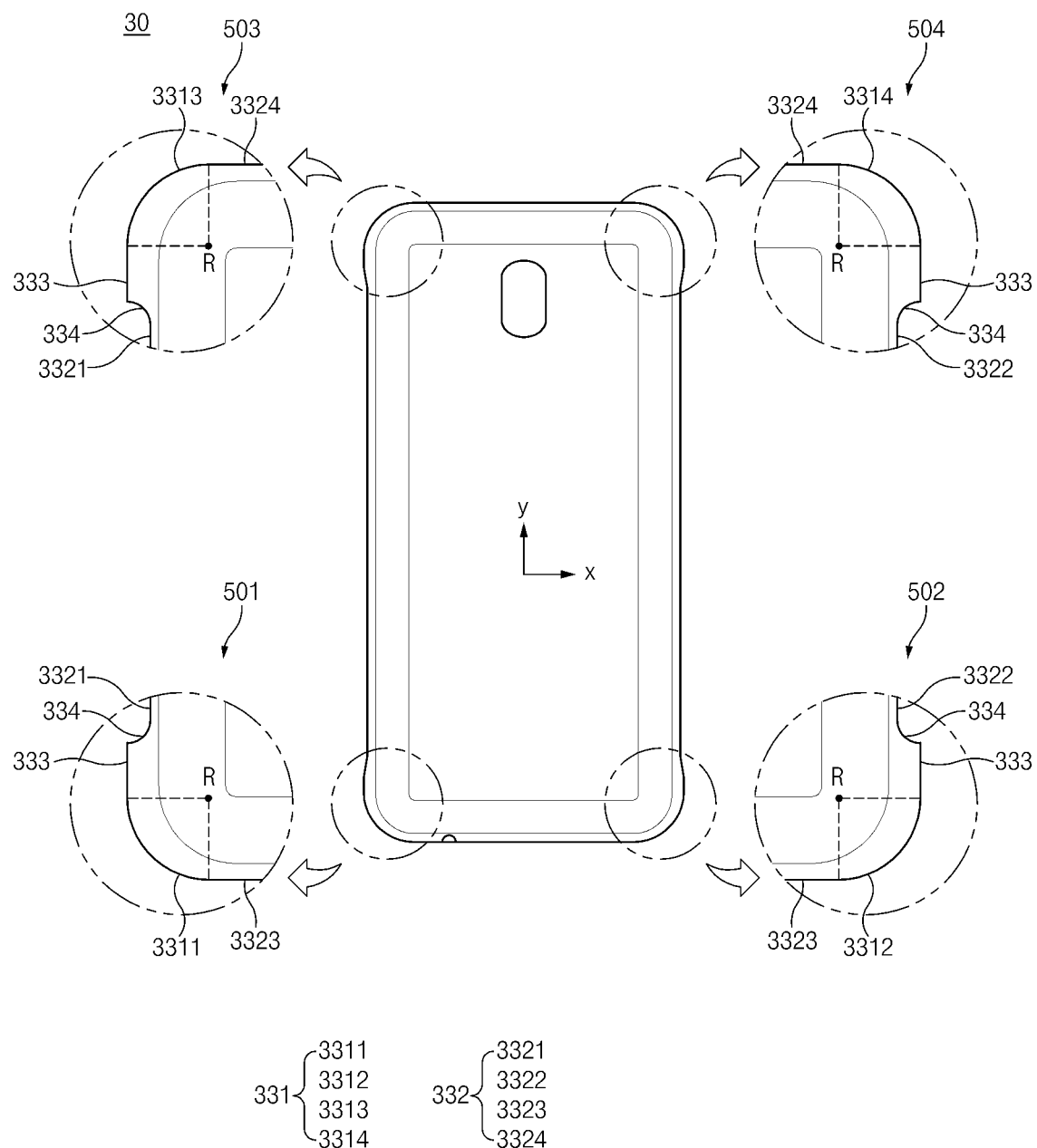
FIG. 5 is a plan view of a housing, according to an embodiment.

FIG. 4 is a view illustrating the recess area of the housing, according to an embodiment. FIG. 5 is a plan view of the housing, according to an embodiment.

Referring to FIGS. 4 and 5, recess areas may be formed in the central part 3303 of the third surface 33 of the housing 30. The recess area of the housing 30 may be formed such that the outer surface of the housing 30 is recessed inward. In other words, a step difference (e.g., step difference "d" in the sectional surface taken along line A-A') may be formed between the extension area 333 extending in the tangential direction from the corner area 331 and the plane area 332. The connection area 334 connecting a step difference portion may include a surface curved inward of the housing 30 or a surface inclined from the extension area 333 or the corner area 331 to the plane area 332.

Referring to FIG. 5, the third surface 33 of the housing 30 includes the corner areas 331 including a first corner area 3311, a second corner area 3312, a third corner area 3313, and a fourth corner area 3314. A portion of the corner areas 331 may be connected with the extension areas 333 provided in the form of a plane.

The extension areas 333 of the housing 30 may extend along the x axis and/or the y axis in the tangential direction of the corner areas 331. One or more extension areas 333 may be formed at one or more corner areas 331. For example, when the extension areas 333 are absent between the corner areas 331 and the connection areas 334, the force of an impact may be concentrated to the connection part between the curved surface of the corner areas 331 and the curved surface of the connection areas 334. Accordingly, the extension areas 333 may be provided in the form of a plane extending in the tangential direction of the corner areas 331 to disperse the impact applied to the corner areas 331.

Referring to FIG. 5, the first corner area 3311, the second corner area 3312, the third corner area 3313, and the fourth corner area 3314 constitute four corners of the housing 30.

Referring to enlarged view 501, an x-axis end portion of the first corner area 3311 is connected to a third plane area 3323, and the y-axis end portion of the first corner area 3311 is connected to a first plane area 3321. The extension areas 333 and the connection areas 334 may be interposed between the y-axis end portion of the first corner area 3311 and the first plane area 3321. The extension areas 333 are extending in the tangential direction from the end portion of the first corner area 3311 and may be provided in the form of a plane. The first plane area 3321 may be recessed inward from the extension areas 333 of the housing 30. The connection areas 334 may be formed between the extension areas 333 and the first plane area 3321. The connection areas 334 may be provided in the curved surface and may be curved inward.

Referring to enlarged view 502, an x-axis end portion of the second corner area 3312 is connected to the third plane area 3323, and the y-axis end portion of the second corner area 3312 is connected to a second plane area 3322. The extension areas 333 and the connection areas 334 may be interposed between the y-axis end portion of the second corner area 3312 and the second plane area 3322. The extension areas 333 are extending in the tangential direction from the end portion of the second corner area 3312 and may be provided in the form of a plane. The second plane area 3322 may be recessed inward from the extension areas 333 of the housing 30. The connection areas 334 may be formed between the extension areas 333 and the second plane area 3322. The connection areas 334 may be provided in the form of a curved surface and may be curved inward.

Referring to enlarged view 503, an x-axis end portion of the third corner area 3313 is connected to a fourth plane area 3324, and the y-axis end portion of the third corner area 3313 is connected to the first plane area 3321. The extension areas 333 and the connection areas 334 may be interposed between the y-axis end portion of the third corner area 3313 and the first plane area 3321. The extension areas 333 are extending in the tangential direction from the end portion of the third corner area 3313 and may be provided in the form of a plane. The first plane area 3321 may be recessed inward from the extension area 333 of the housing 30. The connection areas 334 may be formed between the extension areas 333 and the first plane area 3321. The connection areas 334 may be provided in the form of a curved surface and may be curved inward.

Referring to enlarged view 504, an x-axis end portion of the fourth corner area 3314 is connected to the fourth plane area 3324, and the y-axis end portion of the fourth corner area 3314 is connected to the second plane area 3322. The extension areas 333 and the connection areas 334 may be interposed between the y-axis end portion of the fourth corner area 3314 and the second plane area 3322. The extension areas 333 are extending in the tangential direction from the end portion of the fourth corner area 3314 and may be provided in the form of a plane. The second plane area 3322 may be recessed inward from the extension areas 333 of the housing 30. The connection areas 334 may be formed between the extension areas 333 and the second plane area 3322. The connection areas 334 may be provided in the form of a curved surface and may be curved inward.

The corner areas may be interpreted as including the corner areas 131 and the extension areas 133 of FIG. 1. In this case, the corner areas may include a curved portion (e.g., the corner areas 131) and a plane portion (e.g., the extension areas 133).

Figure 6A:
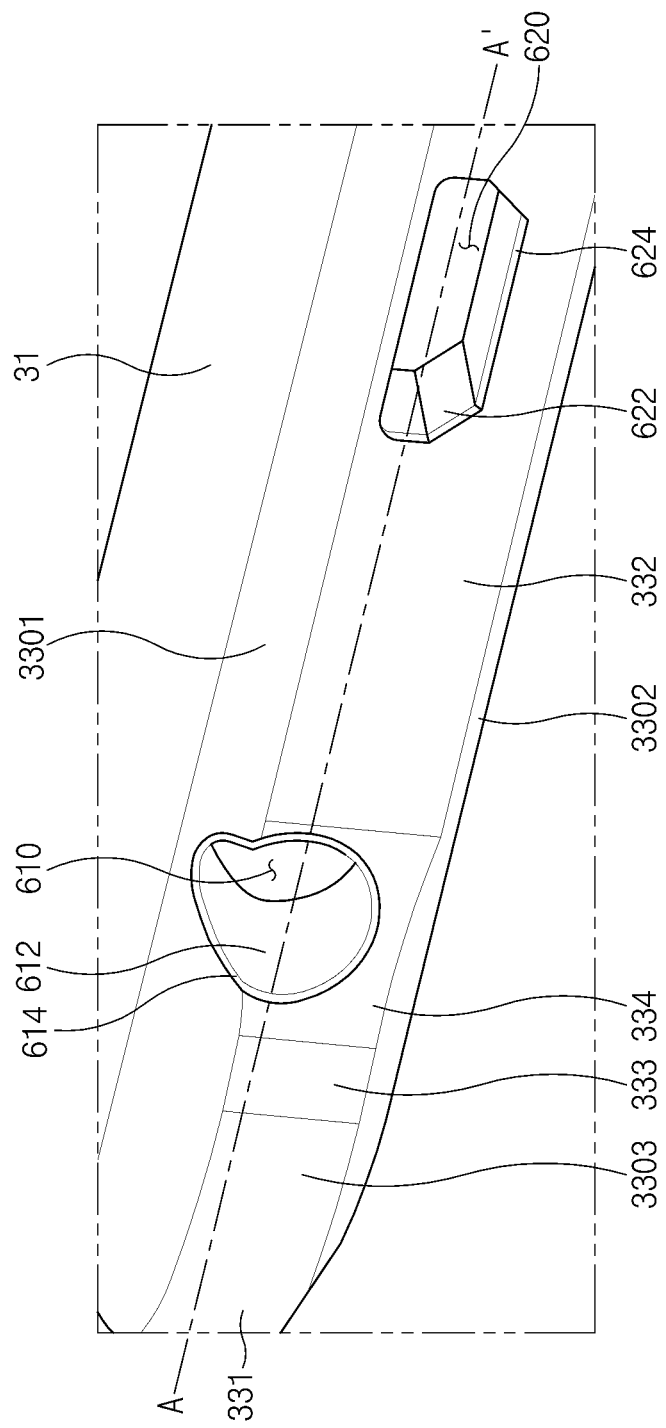
FIGS. 6A and 6B are views illustrating an opening of an electronic device or a housing, according to an embodiment.
Figure 6B:
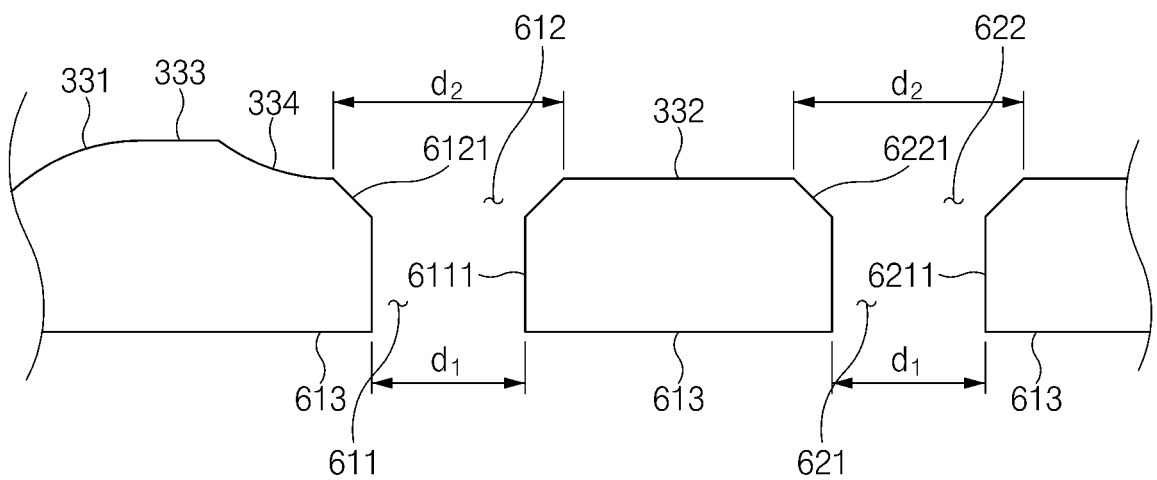

FIGS. 6A and 6B illustrate openings of the electronic device or the housing, according to an embodiment.

Referring to FIG. 6A, at least a portion of a first opening 610 and a second opening 620 are formed in the central part 3303 of the third surface 33 of the housing 30. The first opening 610 may be an earphone connector hole for inserting an earphone. At least a portion of the first opening 610 may be formed in the plane areas 332 and a remaining portion of the first opening 610 may be formed in the connection areas 334. The second opening 620 may be a USB port for inserting a USB connector. At least a portion of the second opening 620 may be formed in the plane areas 332.

Referring to FIG. 6B, the first opening 610 and the second opening 620 include first parts 611 and 621 and second parts 612 and 622.

The first part 611 of the first opening 610 is formed in an inner surface 613 of the housing, one side of the second part 612 of the first opening 610 is connected to the first part 611, and an opposite side of the second part 612 of the first opening 610 may be formed in the plane areas 332 or the curved areas 334 of the housing. The first part 611 may have a first diameter d1 and the second part 612 may have a second diameter d2. The first diameter d1 may be less than the second diameter d2. The diameter of the second part 612 may be increased as it extends outward from the inner part of the housing. The first part 611 may have a cylindrical shape uniformly having the first diameter d1.

The first part 621 of the second opening 620 may be formed in the inner surface 613 of the housing, and the second part 622 of the second opening 620 may be connected to the first part 621 and may be formed in the plane areas 332 of the housing. The first part 621 may have the first diameter d1 and the second part 622 may have the second diameter d2. The first diameter d1 may be less than the second diameter d2. The diameter of the second part 622 may be increased as it extends outward from the inner part of the housing. The first part 621 may have a cylindrical shape uniformly having the first diameter d1.

The openings 610 and 620 may respectively include the first parts 611 and 621 having uniform diameters and the second parts 612 and 622 having gradually increasing diameters. The second parts 612 and 622 of the respective openings 610 and 620 may have diameters sufficient to insert a brush for a polishing process.

In the process of manufacturing the housing 30 including a ceramic material, the inner surfaces 6121 and 6221 of the second parts 612 and 622 may be polished. The polishing process, which is to uniformly polish the surface of the housing 30 or the electronic device 10 by rotating the brush, may essentially be performed to ensure robustness against an external impact and to prevent cracks.

Thus, the housing or the electronic device including ceramic in at least a portion thereof may be polished such that at least a portion (e.g., the inner surfaces 6121 and 6221 of the second parts 612 and 622) of the openings 610 and 620 has uniform surface roughness, thereby preventing cracks and ensuring sufficient stiffness. The inner surfaces 6111 and 6211 of the respective first parts 611 and 621 of the respective openings 610 and 620 may be different from the inner surfaces 6121 and 6221 of the respective second parts 612 and 622 in surface roughness.

Figure 7A:
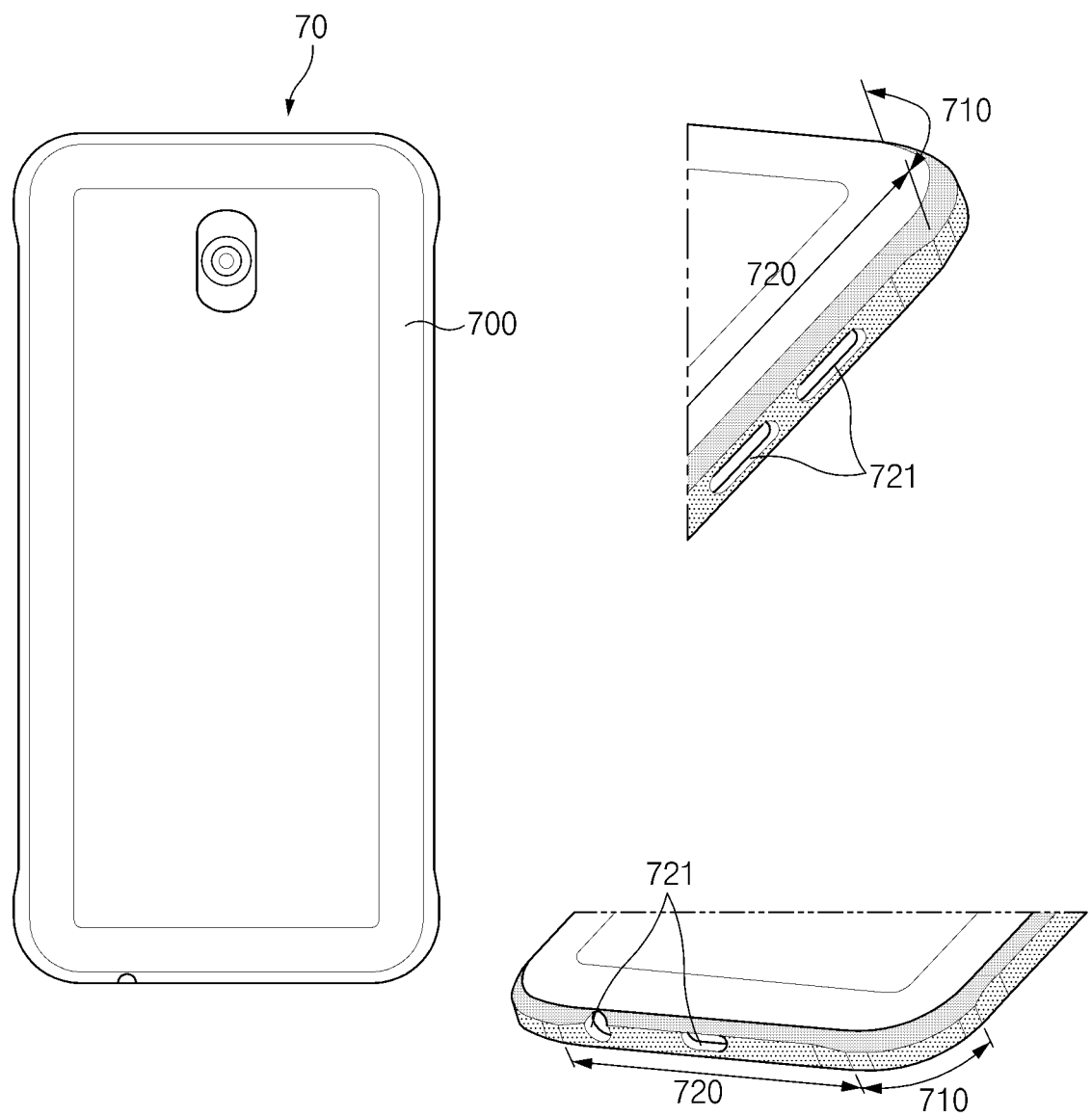
FIGS. 7A and 7B are views illustrating how a falling impact is dispersed to the electronic device, according to an embodiment.
Figure 7B:
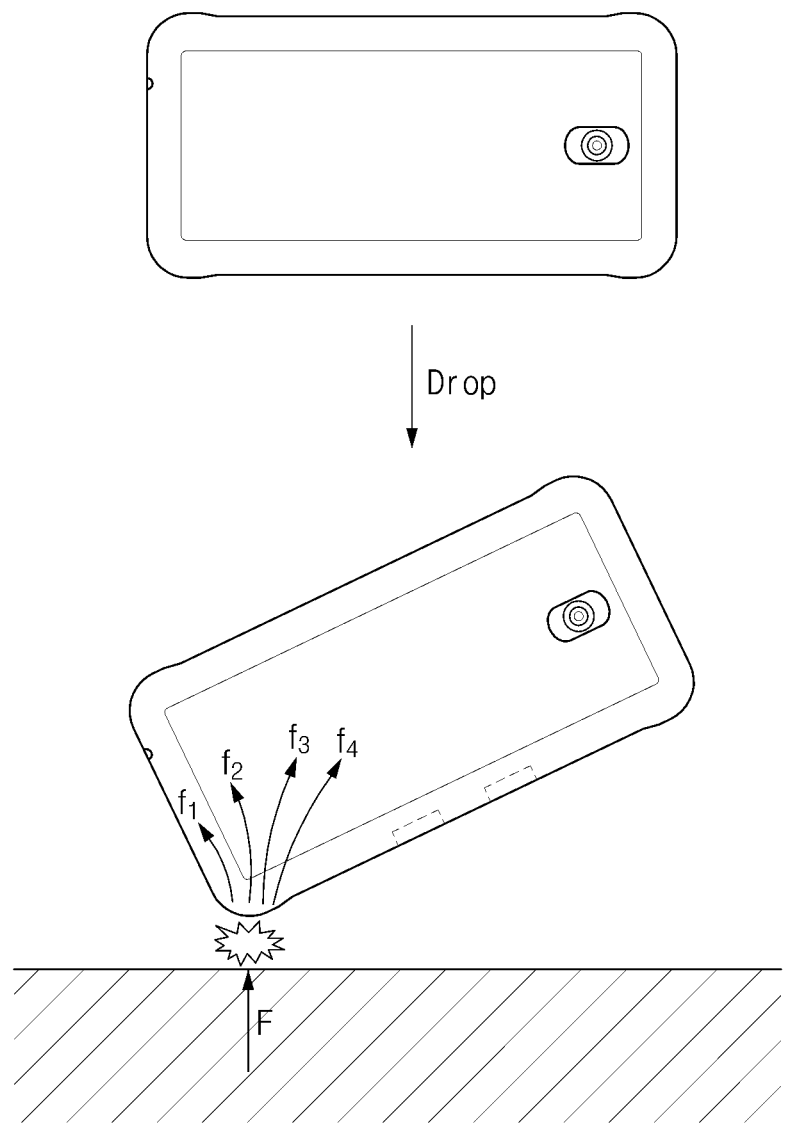

FIGS. 7A and 7B are views illustrating that a falling impact is dispersed when the falling impact is applied to an electronic device 70, according to an embodiment. In this case, the electronic device 70 may correspond to an electronic device described with reference to FIGS. 1 and 2 or an electronic device including a housing described with reference to FIGS. 3 to 6. At least a portion of an outer surface of the electronic device 70 or a housing 700 constituting the outer surface of the electronic device 70 may include a composition including ceramic. In this case, the ceramic may be weaker upon impact than a general material, such as metal or plastic, and may easily cause damage to an opening 721 and/or the peripheral portion of the opening 721.

Referring to FIG. 7A, the electronic device includes a corner area 710 and a recess area 720 connected to the corner area 710 and recessed inward from the corner area 710 of the electronic device 10. The recess area 720 may include plane areas 332 and connection areas 334. The recess area 720 may include one or more openings 721 formed therein. Accordingly, when viewed from the plan view, the electronic device 70 may include four corners, in which the shapes of the corners appear to be protruding outward. In addition, when viewed from the plan view, the electronic device 70 may include the housing 700 including the four corners having the outwardly protruding shape.

Referring to FIG. 7B, when a falling impact is applied to the electronic device 70, the impact may not be directly applied to the recess area 720 having the opening 721 (i.e., the force of the falling impact may be dispersed across different areas of the electronic device 70).

At least a portion (e.g., inner surfaces 6121 and 6221 of the respective second parts 612 and 622) of the inner surface of the opening 721 may be polished, and the polished portion may be weaker in an external impact than another portion. Thus, the corner area 710 may directly receive an impact caused by the ground surface, and the recess area 720, which is recessed inward, may not directly receive the impact. The impact applied through the corner area 710 may be dispersed throughout the entire electronic device 70, and only a portion of the impact may be transmitted to the recess area 720. Accordingly, the opening 721 and the peripheral portion of the opening 721, which are weaker than other areas (i.e., the corner area 710), may avoid being broken due to the impact.

At least a portion of the electronic device or the housing (hereinafter, referred to as "ceramic housing") may include a composition including ceramic, which is a feature differentiated from the remainder of the electronic device or the housing (hereinafter, referred to as "metal housing"), which may include a metal material. For example, the electronic device may include a wireless communication module disposed within the ceramic housing, and thus the communication performance of the wireless communication module may be superior to that of the metal housing. Additionally, although the metal housing includes a split part for ensuring quality radiation performance of the wireless communication module, the ceramic housing may provide quality radiation performance even if the split part is omitted, thereby reducing the size of the wireless communication module. Particularly, in the electronic device, a wireless charging function or an NFC function may be implemented through a rear surface 32 of the housing.

In addition, the ceramic housing may not include an insulating part inside the USB hole (e.g., the second opening 1352 or the second opening 3352), which is not a part of the metal housing. For example, in the metal housing, a portion of the inner part of the USB hole may be insulated to prevent an electric shock accident caused by leakage of current. Such an insulating part may be formed through a double injection. In contrast, the ceramic housing may be formed of a non-conductive material, so the insulating part may be omitted, thereby simplifying the manufacturing process.

Various types of the electronic devices may be provided. The electronic device may include, for example, a portable communication device (e.g., a smartphone), a computer device, a portable multimedia device, a mobile medical appliance, a camera, a wearable device, or a home appliance. The electronic device should not be limited to the above-mentioned devices.

It should be understood that various embodiments of the present disclosure and terms used in the embodiments do not intend to limit technical features disclosed in the disclosure to particular embodiments disclosed herein; rather, the disclosure should be construed to cover various modifications, equivalents, or alternatives of embodiments of the disclosure.

The term "module" may include a unit implemented in hardware, software, or firmware and may be interchangeably used with the terms "logic", "logical block", "part" and "circuit". The "module" may be a minimum unit of an integrated part or may be a part thereof. The "module" may be a minimum unit for performing one or more functions or a part thereof. For example, according to an embodiment, the "module" may include an application-specific integrated circuit (ASIC).

Various embodiments of the disclosure may be implemented by software (e.g., the program) including an instruction stored in a machine-readable storage medium (e.g., an internal memory or an external memory) readable by a machine (e.g., the electronic device). For example, the processor of a machine (e.g., the electronic device) may call the instruction from the machine-readable storage medium and execute the instruction. This means that the machine may perform at least one function based on the called instruction. One or more instructions may include a code generated or executed by a compiler or an interpreter. The machine-readable storage medium may be provided in the form of non-transitory storage medium. The term "non-transitory", as used herein, means that the storage medium is tangible, but does not include a signal (e.g., an electromagnetic wave). The term "non-transitory" does not differentiate a case where the data is permanently stored in the storage medium from a case where the data is temporally stored in the storage medium.

The method according to various embodiments disclosed herein may be provided as a part of a computer program product. The computer program product may be sold, bought or traded between a seller and a buyer. The computer program product may be distributed in the form of machine-readable storage medium (e.g., a compact disc read only memory (CD-ROM)) or may be directly distributed (e.g., downloaded or uploaded) online through an application store (e.g., a Play Store™) or between two user devices (e.g., smartphones). In the case of online distribution, at least a portion of the computer program product may be temporarily stored or generated in a machine-readable storage medium such as a memory of a manufacturer's server, an application store's server, or a relay server.

According to various embodiments, each component (e.g., the module or the program) of the above-described components may include one or plural entities. At least one or more components of the above components or operations may be omitted, or one or more components or operations may be added. Alternatively or additionally, some components (e.g., the module or the program) may be integrated into one component. In this case, the integrated component may perform the same or similar functions performed by each corresponding component prior to the integration. Operations performed by a module, a program, or other components may be executed sequentially, in parallel, repeatedly, or in a heuristic method. At least some operations may be executed in different sequences, omitted, or other operations may be added.

According to various embodiments, when an impact due to falling or dropping is applied to the electronic device, the falling impact is prevented from directly being applied to the opening and the peripheral portion of the opening, which are formed in the housing. In addition, a portion of the inner surface of the opening formed in the housing may be polished. In addition, the USB module of the electronic device may not include an additional insulating structure. Further, the electronic device or the wireless communication module of the electronic device may not have a split part to ensure radiation performance.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. A housing of an electronic device, the housing comprising:
    a first surface facing a first direction;
    a second surface facing a second direction opposite to the first direction; and
    a third surface surrounding a space between the first surface and the second surface,
    wherein the third surface includes:
    a plurality of corner areas; and
    a plurality of plane areas to connect the corner areas to each other,
    wherein a plane area of the plurality of plane areas includes a recess area on the housing recessed inward along a peripheral portion of the recess area,
    wherein an opening is formed in part of the recess area,
    wherein an inner surface of the opening consists of ceramic,
    wherein the opening further includes a first portion formed in an inner surface of the housing and a second portion formed in a recess area in an outer surface of the housing, the second portion being larger than the first portion, and
    wherein a surface roughness of the first portion and the surface roughness of the second portion are different.

2. The housing of claim 1, wherein the third surface further includes a connection area to connect the recess area with the peripheral portion of the recess area.

3. The housing of claim 2, wherein the connection area further includes a plane surface inclined toward the recess area from the peripheral portion of the recess area.

4. The housing of claim 2, wherein the connection area further includes a curved surface on the housing curved inward from the peripheral portion of the recess area to the recess area.

5. The housing of claim 2, wherein the corner area further includes a curved portion including a round surface in a portion of the curved portion, and
wherein the curved portion is connected with the connection area.

6. The housing of claim 5, wherein the corner area further includes plane portions extending to opposite sides of the curved portion and connected with the connection area.

7. The housing of claim 1, wherein the plurality of corner areas further include a first corner area and a second corner area formed at a position perpendicular to the first direction and the second direction, and
wherein the recess area is interposed between the first corner area and the second corner area to connect the first corner area with the second corner area.

8. The housing of claim 1, wherein the diameter of the first part is uniform, and the diameter of the second part gradually increases from the first part to the outer surface of the housing.

9. The housing of claim 1, wherein the third surface further includes:
a first frame part bent in a direction different than the first direction, extending from an edge of the first surface and surrounding the edge of the first surface,
a second frame part bent in a direction different than the second direction, extending from an edge of the second surface and surrounding the edge of the second surface, and
a central part interposed between the first frame part and the second frame part, and
wherein the first frame part is inclined while extending from the first surface to one side of the central part, and the second frame part is inclined while extending from the second surface to a side opposite of the one side of the central part.

10. The housing of claim 9, wherein at least one of a portion of the plane area, the corner area, the recess area, and the connection area is formed in the central part.

11. The housing of claim 9, wherein the first frame part and the second frame part include a curved surface having a specific curvature, and
wherein the plane area in the central part includes a plane perpendicular to the first direction or the second direction.

12. The housing of claim 1, wherein a portion of the housing is ceramic.

13. An electronic device comprising:
a first surface on which a display is disposed, a second surface facing the first surface, and a side surface surrounding a space between the first surface and the second surface,
wherein the side surface includes:
a first corner area, a second corner area facing the first corner area in a first direction, a first plane area extending in a second direction from the first corner area, and a second plane area extending in the second direction from the second corner area and facing the first plane area in the first direction,
wherein the first plane area is spaced apart from the second plane area by a first width,
wherein the first corner area includes a first end portion connected to the first plane area,
wherein the second corner area includes a second end portion connected to the second plane area,
wherein the first end portion is spaced apart from the second end portion along a second width greater than the first width,
wherein an opening is formed in part of the second plane area,
wherein an inner surface of the opening consists of ceramic,
wherein the opening further includes a first portion formed in an inner surface of the housing and a second portion formed in a recess area in an outer surface of the housing, the second portion being larger than the first portion, and
wherein the second portion of the opening is formed by performing a polishing process.

14. The electronic device of claim 13, wherein the first direction is perpendicular to the second direction, and
wherein the display is disposed to face a direction perpendicular to the first direction and the second direction.

15. The electronic device of claim 13, wherein a button member is inserted into the opening, and
wherein a portion of the button member protrudes from a surface of the first plane area or the second plane area.

16. The electronic device of claim 13, wherein the opening includes a universal serial bus connector port or an earphone connector port.

17. The electronic device of claim 13, further comprising a first extension area extending in the first direction from the first corner area and a second extension area extending in the first direction from the second corner area.

18. The electronic device of claim 17, wherein the first extension area is spaced apart from the second extension area by a third width, and
wherein the third width is greater than the second width.

* * * * *